United States Patent
Ohtsuka

(10) Patent No.: US 11,917,785 B2
(45) Date of Patent: Feb. 27, 2024

(54) CIRCUIT-BOARD HOLDER AND IMAGE FORMING APPARATUS

(71) Applicant: Rie Ohtsuka, Kanagawa (JP)

(72) Inventor: Rie Ohtsuka, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 190 days.

(21) Appl. No.: 17/497,188

(22) Filed: Oct. 8, 2021

(65) Prior Publication Data

US 2022/0124932 A1 Apr. 21, 2022

(30) Foreign Application Priority Data

Oct. 19, 2020 (JP) ................................ 2020-175315

(51) Int. Cl.
 *H05K 7/20* (2006.01)
 *G03G 15/00* (2006.01)
 *H05K 7/14* (2006.01)

(52) U.S. Cl.
 CPC ........... *H05K 7/1417* (2013.01); *G03G 15/80* (2013.01)

(58) Field of Classification Search
 CPC ............................ H05K 7/1417; G03G 15/80
 See application file for complete search history.

(56) References Cited

U.S. PATENT DOCUMENTS

| 8,643,688 B1 * | 2/2014 | Chen .................... B41J 11/0095 347/217 |
| 2013/0250328 A1 | 9/2013 | Ohtsuka et al. |
| 2017/0185025 A1 | 6/2017 | Wakabayashi et al. |
| 2020/0165086 A1 | 5/2020 | Zaitsu et al. |
| 2021/0153373 A1 * | 5/2021 | Chen ........................ H05K 7/02 |

FOREIGN PATENT DOCUMENTS

| JP | 10-303574 | 11/1998 |
| JP | 2006-196773 | 7/2006 |
| JP | 2013-229414 | 11/2013 |

* cited by examiner

*Primary Examiner* — Mukundbhai G Patel
(74) *Attorney, Agent, or Firm* — Harness, Dickey & Pierce, P.L.C.

(57) ABSTRACT

A circuit-board holder includes a first restraint, a second restraint, and a third restraint. The first restraint restricts a circuit board from moving in a direction orthogonal to an insertion direction of the circuit board. The circuit board is inserted to the circuit-board holder in a direction parallel to a surface of the circuit board. The second restraint restricts the circuit board from moving in a normal-line direction to the surface of the circuit board. The third restraint restricts the circuit board from moving in the insertion direction of the circuit board when the circuit board has been inserted to a prescribed position. One end of the third restraint in the insertion direction of the circuit board is fixed. Another end of the third restraint in the insertion direction of the circuit board is elastically deformable and displaceable in a normal-line direction to the surface of the circuit board.

7 Claims, 5 Drawing Sheets

CIRCUIT-BOARD HOLDER AND IMAGE FORMING APPARATUS

CROSS-REFERENCE TO RELATED APPLICATION

This patent application is based on and claims priority pursuant to 35 U.S.C. § 119(a) to Japanese Patent Application No. 2020-175315, filed on Oct. 19, 2020, in the Japan Patent Office, the entire disclosure of which is hereby incorporated by reference herein.

BACKGROUND

Technical Field

Embodiments of the present disclosure relate to a circuit-board holder and an image forming apparatus.

Description of the Related Art

There is known a circuit-board holder for holding a circuit board using a snap fit. For example, a circuit-board holder that includes a rib and a restraint member is disclosed. The rib contacts a surface of a printed circuit board arranged so as to face a surface of another printed circuit board. The restraint member snap-fits to an end (engaged portion) of the printed circuit board to restrict the movement of the printed circuit board. The restraint member includes an elastic portion erected from the surface of the printed circuit board facing the other printed circuit board and a hooking claw (engagement portion) provided at a tip of the elastic portion.

When the printed circuit board is held by the circuit-board holder, the printed circuit board is pressed against the base plate of the circuit-board holder in a state in which the end of the printed circuit board contacts a tapered surface formed on an upper surface of the elastic portion (an upper surface of the hooking claw) of the circuit-board holder. Such a configuration as described above allows the elastic portion as an elastic member to bend and the hooking claw to shift. Accordingly, the tip of the printed circuit board moves beyond the hooking claw and the printed circuit board is pressed against the rib such that the printed circuit board contacts the rib. Thus, bending of the elastic portion is restored and the hooking claw is engaged with the tip of the printed circuit board. The above-described engagement of the hooking claw with the tip of the printed circuit board restrains the printed circuit board from moving away from the base plate of the circuit-board holder (upstream in a direction in which the printed circuit board is inserted to the circuit-board holder).

SUMMARY

In an aspect of the present disclosure, a circuit-board holder includes a first restraint, a second restraint, and a third restraint. The first restraint restricts a circuit board from moving in a direction orthogonal to an insertion direction of the circuit board. The circuit board is inserted to the circuit-board holder in a direction parallel to a surface of the circuit board. The second restraint restricts the circuit board from moving in a normal-line direction to the surface of the circuit board. The third restraint restricts the circuit board from moving in the insertion direction of the circuit board when the circuit board has been inserted to a prescribed position. One end of the third restraint in the insertion direction of the circuit board is fixed. Another end of the third restraint in the insertion direction of the circuit board is elastically deformable and displaceable in a normal-line direction to the surface of the circuit board. The third restraint includes an engagement portion at said another end of the third restraint. The third restraint is engaged with a to-be-engaged portion of the circuit board using a snap fit.

In another aspect of the present disclosure, an image forming apparatus includes the circuit-board holder. The circuit board is detachably held by the circuit-board holder.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

Figure 1:
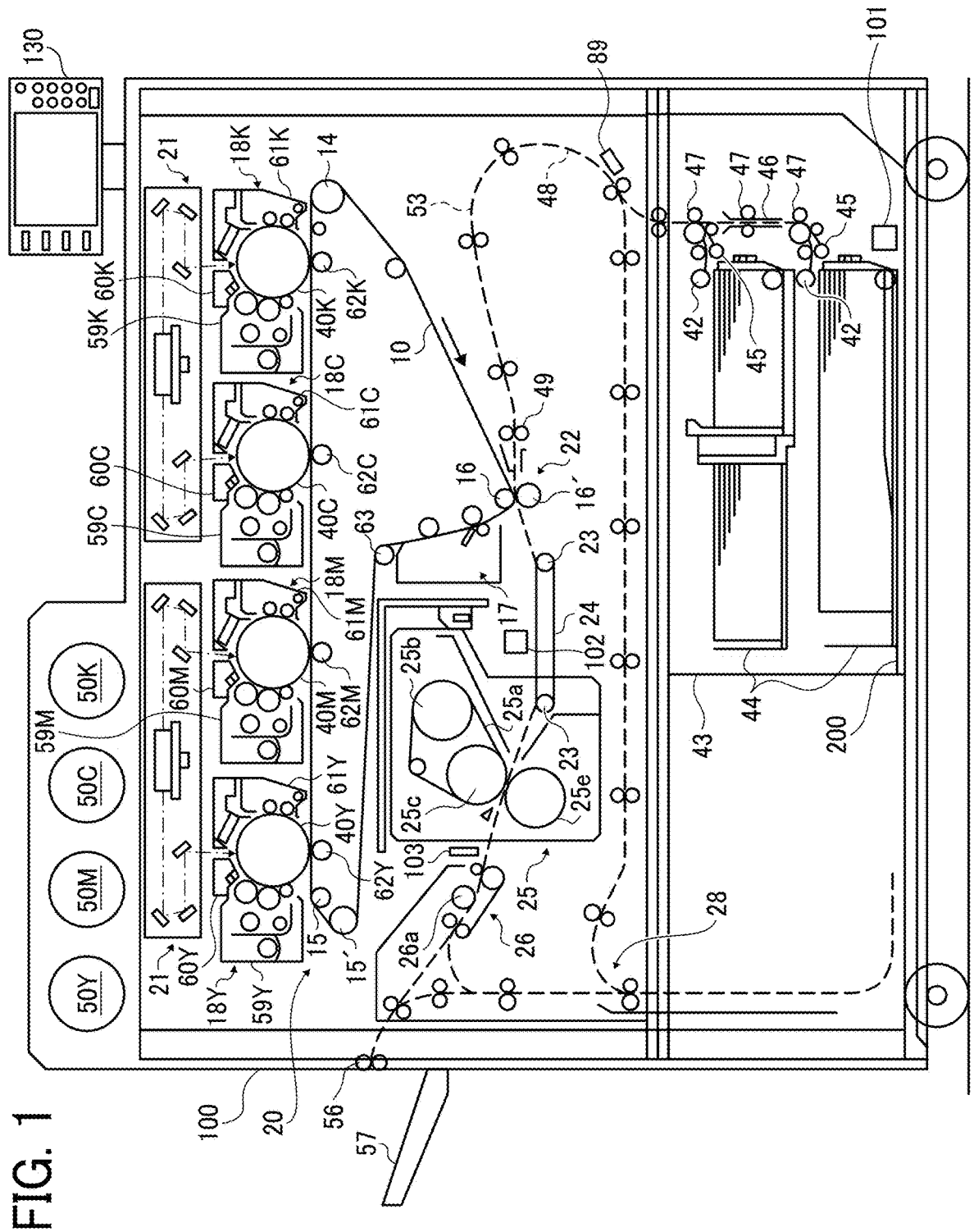
FIG. 1 is a schematic view of a printer according to an embodiment of the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity.

However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Referring now to the drawings, embodiments of the present disclosure are described below. In the drawings for explaining the following embodiments, the same reference codes are allocated to elements (members or components) having the same function or shape and redundant descriptions thereof are omitted below.

Hereinafter, an electrophotographic printer 100 serving as an image forming apparatus according to an embodiment of the present disclosure is described.

In the present embodiment, an electrophotographic image forming apparatus is described as an example. However, the image forming apparatus may be another type of image forming apparatus such as an inkjet printer.

First, a basic configuration of the printer 100 according to the present embodiment is described.

FIG. 1 is a schematic view of the printer 100 according to the present embodiment.

As illustrated in FIG. 1, the printer 100 includes a sheet feeder (sheet feeding table) for feeding a recording sheet as a recording medium stored in the sheet feeder to a sheet feeding path, and a printing device mounted on the sheet feeder. Suffixes Y, M, C, and K attached to each reference numeral in FIG. 1 indicate that components indicated thereby are used for forming yellow, magenta, cyan, and black images, respectively.

An endless intermediate transfer belt 10, which is looped around a plurality of support rollers 14, 15, 15', 16 and 63 and movable endlessly in the clockwise direction in FIG. 1, is provided in a vicinity of the center of the printing device. A belt cleaner 17 is in contact with the intermediate transfer belt 10 from the outer circumferential surface of the intermediate transfer belt 10 in a position in which the intermediate transfer belt 10 is wound around cleaning backup rollers in the entire surface of the circumferential direction of the intermediate transfer belt 10. The belt cleaner 17 removes transfer residual toner remaining on the outer circumferential surface of the intermediate transfer belt 10 after passing through a secondary transfer nip described later.

In the entire surface of the circumferential direction of the intermediate transfer belt 10, a region between a driving roller 14 serving as a support roller and a support roller 15 extends in a substantially horizontal direction. A tandem image forming device 20 is disposed above the region described above. In the tandem image forming device 20, four image forming devices 18Y, 18M, 18C, and 18K for yellow, magenta, cyan, and black, respectively, arranged along the outer circumferential surface of the intermediate transfer belt 10 face the outer circumferential surface of the intermediate transfer belt 10.

Optical writing devices 21, serving as latent image forming devices, are disposed above the tandem image forming device 20. The image forming devices 18Y, 18M, 18C, and 18K of the tandem image forming device 20 include drum-shaped photoconductors 40Y, 40M, 40C, and 40K, respectively, as latent image carriers on which latent images of yellow, magenta, cyan, and black, respectively, are formed. After the surfaces of the photoconductors 40Y, 40M, 40C, and 40K are uniformly charged by chargers 60Y, 60M, 60C, and 60K to, for example, −650V, the optical writing devices 21, which drive light sources based on an image data, perform optical scanning on the surfaces of the photoconductors 40Y, 40M, 40C, and 40K. Portions on the surfaces of the photoconductors 40Y, 40M, 40C, and 40K generated by the light scanning attenuate potential (for example, -50V) to form electrostatic latent images.

The electrostatic latent images formed on the surfaces of the photoconductors 40Y, 40M, 40C, and 40K are developed by respective developing devices 59Y, 59M, 59C, and 59K into Y, M, C, and K toner images, respectively. Y, M, C, and K toner are supplied to the developing devices 59Y, 59M, 59C, and 59K, respectively, from toner bottles 50Y, 50M, 50C, and 50K as needed. Developers for Y, M, C, and K colors obtained by mixing toner for Y, M, C, and K colors, respectively and magnetic carrier are stirred in the developing devices 59Y, 59M, 59C, and 59K, respectively. The toner for Y, M, C, and K colors in the respective Y, M, C, and K developers are negatively charged by friction (for example, −30 μC/g). Developing rollers for Y, M, C, and K colors are disposed in the respective developing devices 59, 59M, 59C, and 59K. Each of the developing rollers for Y, M, C, and K colors have a portion of peripheral surfaces thereof exposed to the outside through an opening provided in the casing so as to face the respective photoconductors 40Y, 40M, 40C, and 40K. Each of the developers for Y, M, C, and K colors drawn up by the respective developing rollers for Y, M, C, and K colors is conveyed, as the developing rollers rotate, to each one of developing regions facing the corresponding one of the photoconductors 40Y, 40M, 40C, and 40K. In each of the developing regions, developing potential that moves the negative toner from each of the developing rollers to corresponding one of the latent images, acts between each of the electrostatic latent images on corresponding one of the photoconductors 40Y, 40M, 40C, and 40K and corresponding one of the developing rollers to which a developing bias (for example, −500V) is applied. The developing potential causes the toner for Y, M, C, and K colors on the respective developing rollers for Y, M, C, and K colors to be separated from corresponding one of the magnetic carriers and transferred to the corresponding one of electrostatic latent images on the photoconductors 40Y, 40M, 40C, and 40K. The electrostatic latent images that are formed on the surfaces of the photoconductors 40Y, 40M, 40C, and 40K are developed by the developing devices 59Y, 59M, 59C, and 59K to form toner images of Y, M, C, and K colors, respectively.

Primary transfer rollers 62Y, 62M, 62C, and 62K are disposed below the photoconductors 40Y, 40M, 40C, and 40K, respectively, and press the intermediate transfer belt 10 toward the photoconductors 40Y, 40M, 40C, and 40K, respectively. Accordingly, primary transfer nips for Y, M, C, and K colors are formed at which the respective photoconductors 40Y, 40M, 40C, and 40K contact the intermediate transfer belt 10. Primary transfer electric fields are formed between the primary transfer rollers 62Y, 62M, 62C, and 62K to which primary transfer biases are applied and the electrostatic latent images on the respective photoconductors 40Y, 40M, 40C, and 40K around the primary transfer nips for Y, M, C, and K colors, respectively.

When the printer 100 receives the image data, the driving roller 14 is rotationally driven by a driver to endlessly move the intermediate transfer belt 10 in the clockwise direction in FIG. 1. At the same time, the image forming devices 18Y,

18M, 18C, and 18K are driven to form respective toner images for Y, M, C, and K colors on the photoconductors 40Y, 40M, 40C, and 40K, respectively. The toner images are primarily transferred onto the outer peripheral surface of the intermediate transfer belt 10 in a superimposed manner at the primary transfer nips for Y, M, C, and K colors. Such a configuration as described above allows a four-color composite toner image to be formed on the outer circumferential surface of the intermediate transfer belt 10.

When a monochrome image of black is formed on the intermediate transfer belt 10, the support roller 15 and 15' other than the driving roller 14 may be moved to separate the photoconductors 40Y, 40M, and 40C of yellow, magenta, and cyan, respectively from the intermediate transfer belt 10.

After the photoconductors 40Y, 40M, 40C, and 40K has passed through the respective primary transfer nips for Y, M, C, and K colors, transfer residual toner that has not been primarily transferred onto the intermediate transfer belt 10 remains on the surfaces of the photoconductors 40Y, 40M, 40C, and 40K. The transfer residual toner is removed from the surfaces of the photoconductors 40Y, 40M, 40C, and 40K by the drum cleaners 61Y, 61M, 61C, and 61K, respectively, and then conveyed to corresponding one of waste toner bottles. After the photoconductors 40Y, 40M, 40C and 40K have been cleaned, the surfaces of the photoconductors 40Y, 40M, 40C and 40K, are uniformly charged again by the chargers 60Y, 60M, 60C and 60K, respectively.

The printer 100 selectively rotates one of sheet feeding rollers 42 on a sheet feed table 200 of the sheet feeder. Thus, the recording sheet is fed out from one of a plurality of sheet feed cassettes 44 provided in a sheet bank 43 having a plurality of stages. After the recording sheets have been separated to single sheets by a separation roller pair 45 and fed one by one to the sheet feeding path, the recording sheets are conveyed by the conveyance roller pair 47 and enter a sheet feeding path 48 of the printing device. The recording sheet that has entered the sheet feeding path 48 of the printing device abuts against a registration nip of a registration roller pair 49 and stops.

A secondary transfer device 22 is provided below the intermediate transfer belt 10. The secondary transfer device 22 brings the secondary transfer roller 16' into contact with a portion of the entire circumferential surface of the intermediate transfer belt 10 at which a secondary transfer counter roller 16 serving as a support roller is looped to form a secondary transfer nip.

The registration roller pair 49 starts to rotate at a timing at which the recording sheet is superimposed on the four-color composite toner image on the intermediate transfer belt 10 at the secondary transfer nip, and feeds the recording sheet toward the secondary transfer nip. In the secondary transfer nip, the four-color composite toner image on the intermediate transfer belt 10 is secondarily transferred to the recording sheet by the action of the secondary transfer electric field and the nip pressure to form a full-color image.

The recording sheet that has passed through the secondary transfer nip is sent to a fixing device 25, and the full-color image is fixed on the surface of the recording sheet. The recording sheet that has passed through the fixing device 25 and increased in temperature is sent to a cooler 26 to be cooled. Thereafter, the recording sheet is ejected to the outside of the printer 100 via a sheet ejection roller pair 56 and then stacked on an output tray 57.

In a duplex printing mode in which images are formed on both sides of the recording sheet, the recording sheet in which the toner image has been fixed only on the first side of the recording sheet passes through the cooler 26 and is then sent to a sheet re-feeder 28 instead of the sheet ejection roller pair 56. The recording sheet is re-fed to the sheet feeding path 48 while being reversed by the sheet re-feeder 28. Then, the recording sheet is fed from the sheet feeding path 48 to the secondary transfer nip, and the four-color composite toner image is secondarily transferred onto the second side of the recording sheet. Thereafter, the recording sheet is ejected to the outside of the printer 100 via the fixing device 25 and the sheet ejection roller pair 56.

The belt cleaner 17 removes the transfer residual toner adhering to the surface of the intermediate transfer belt 10 having passed through the secondary transfer nip. Thereafter, the intermediate transfer belt 10 enters the primary transfer nips for Y, M, C, and K colors again. The toner stored in the belt cleaner 17 is collected to the waste toner bottles by a conveyor.

The printer 100 according to the present embodiment includes a sheet-feeder temperature sensor 101 that detects the temperature in a sheet bank 43 as a temperature sensor. The printer 100 also includes a pre-fixing temperature sensor 102 that detects the temperature of a recording sheet S, which is a recording sheet immediately before fixing, between the secondary transfer device 22 and the fixing device 25. The printer 100 also includes a post-fixing temperature sensor 103 that detects the temperature of the recording sheet S, which is a recording sheet immediately after fixing, between the fixing device 25 and the cooler 26 as a first point. In addition, the printer 100 includes a fixing belt temperature sensor that detects the temperature of a fixing belt 25a as a temperature sensor. Other temperature sensors such as temperature sensors for detecting temperatures in the vicinity of the developing devices 59Y, 59M, 59C, and 59K and temperature sensors for detecting temperatures in the vicinity of the sheet ejection roller pair 56 may be provided.

Next, the configurations of a sensor board 350 including the temperature sensor and a circuit-board holder 300 holding the sensor board 350 is described.

In the following description, the sensor board 350 employed as the sheet-feeder temperature sensor 101 is described as an example. However, the same description applies to other temperature sensors. The sensor board 350 according to the present embodiment includes a temperature sensor. However, the present embodiment can be applied to a sensor board of any sensor such as a humidity sensor, an image sensor, or a distance measuring sensor in a similar manner. Further, the present embodiment is not limited to a circuit board on which a sensor is mounted. However, the present embodiment can also be applied to a circuit board on which a component is mounted.

Figure 2:
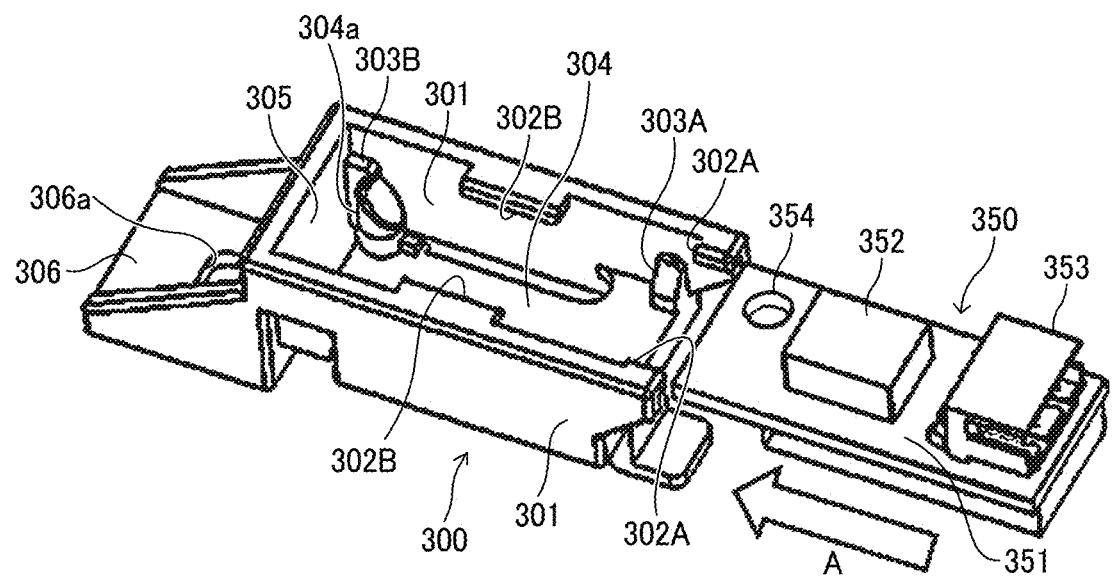
FIG. 2 is a perspective view of a sensor board and a circuit-board holder provided for the printer of FIG. 1, where the sensor board is not-yet inserted into the circuit-board holder.

FIG. 2 is a perspective view of the sensor board 350 and the circuit-board holder 300 provided for the printer 100, where the sensor board 350 is not-yet inserted into the circuit-board holder 300, according to the present embodiment.

Figure 3:
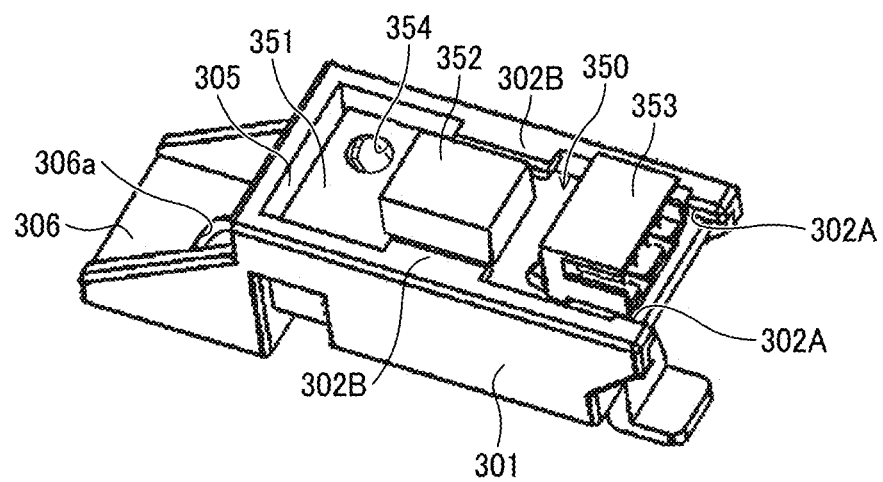
FIG. 3 is a perspective view of the sensor board and the circuit-board holder of FIG. 2, where the sensor board is inserted into a predetermined position in the circuit-board holder.

FIG. 3 is a perspective view of the sensor board 350 and the circuit-board holder 300 provided for the printer 100, where the sensor board 350 is inserted into a predetermined position in the circuit-board holder 300, according to the present embodiment.

The sensor board 350 according to the present embodiment is provided with a printed circuit board 351, and a temperature sensor 352 and a connector 353 are mounted on a first surface of the printed circuit board 351 on the front side. Each of the temperature sensor 352 and the connector 353 has a lead wire, and these lead wires are soldered to the printed circuit board 351. The printed circuit board 351 of the sensor board 350 has a through hole 354. As known in the art, the through hole 354 is a hole through which a screw passes to fix the sensor board 350 onto an object such as a frame of an apparatus.

The sensor board 350 may be provided with a lead that protrudes from a second surface of the printed circuit board 351 on the rear side, or may be provided with a circuit component on the rear side of the printed circuit board 351. Accordingly, when the sensor board 350 is directly fixed to the object, the lead wire or the circuit component on the rear side of the printed circuit board 351 contacts the object, and stably fixing the sensor board 350 to the fixed portion is difficult. In particular, the sensor board 350 according to the present embodiment is fixed onto a metal frame of the sheet bank 43, and serves as the sheet-feeder temperature sensor 101. Note that the metal frame of the sheet bank 43 is an example of the above object to which the sensor board 350 is to be fixed. When the object is conductive as described above and the lead wire or the circuit component on the rear side of the sensor board 350 contacts the object, there is a risk of short-circuiting or leakage of electric current.

In order to handle such a situation, in the present embodiment, the sensor board 350 is held by the circuit-board holder 300, and the circuit-board holder 300 is fixed to the object in the printer 100. Such a configuration as described above allows the rear side of the sensor board 350 to be separated from the object and allows the sensor board 350 to float from the object. Thus, the sensor board 350 can still be fixed to the object with stability.

Figure 4:
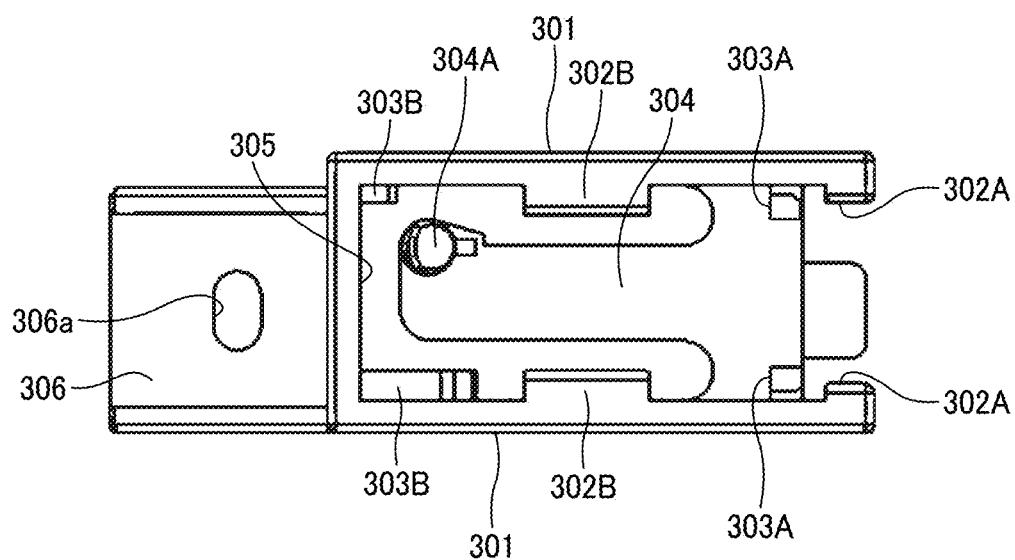
FIG. 4 is a plan view of the circuit-board holder of FIG. 2.

FIG. 4 is a plan view of the circuit-board holder 300 according to the present embodiment.

Figure 5:
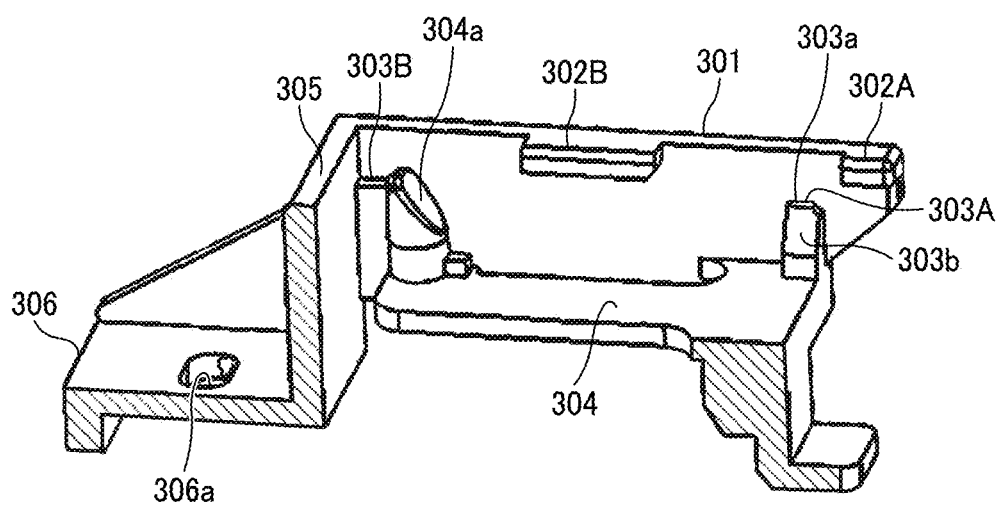
FIG. 5 is a perspective sectional view of the circuit-board holder of FIG. 2, illustrating its internal structure.

FIG. 5 is a plan view of the circuit-board holder 300 illustrating an internal configuration of the circuit-board holder 300 according to the present embodiment.

The circuit-board holder 300 of the present embodiment is an integrally molded product made of resin and having an approximately rectangular shape and holds the sensor board 350 using a snap fit. Such a configuration as described above allows the number of fixing components such as screws to be reduced. Thus, ease of assembly can be enhanced.

The circuit-board holder 300 includes first restraints and second restraints. The first restraints restrict the movement of the sensor board 350 inserted in an insertion direction A parallel to the surface of the sensor board 350 to lateral sides of the insertion direction A. The second restraints restrict the movement of the sensor board 350 to a normal-line direction to the surface of the sensor board 350.

The first restraints of the present embodiment includes side walls 301 of the circuit-board holder 300 positioned on a lateral side of the sensor board 350 in the insertion direction A. Each one of lateral sides of the sensor board 350 contacts an inner wall of each of the side walls 301. Thus, the movement of the sensor board 350 toward the insertion direction A is restricted.

The second restraints of the present embodiment include projecting portions 302A and 302B and ribs 303A and 303B that contact the front and rear sides, respectively, of the printed circuit board 351 of the sensor board 350. The projecting portions 302A and 302B contact the front surface (a first surface) of the sensor board 350 at different positions in the insertion direction A. Thus, the movement of the sensor board 350 toward the front surface of the sensor board 350 (upper side in FIG. 2 and FIG. 3) is restricted. The ribs 303A and 303B contact the rear side (a second surface) of the sensor board 350 at different positions in the insertion direction A. Thus, the movement of the sensor board 350 toward the rear side of the sensor board 350 (lower side in FIG. 2 and FIG. 3) is restricted. The projecting portions 302A and 302B and the ribs 303A and 303B are arranged so as not to interfere with, for example, components and wiring on the printed circuit board 351.

The two projecting portions 302A positioned upstream in the insertion direction A are provided at lateral side ends of the front surface of the side walls 301 (upper ends in FIGS. 2 and 3) of the circuit-board holder 300. Thus, each of the projecting portions 302A contacts each of the lateral side surfaces of the sensor board 350. The two projecting portions 302B positioned downstream in the insertion direction A are also provided at lateral side ends of the front surface (upper ends in FIGS. 2 and 3) of the side walls 301 of the circuit-board holder 300. Thus, each of the projecting portions 302B contacts each of the lateral side surfaces of the sensor board 350.

Each of the two ribs 303A positioned upstream in the insertion direction A is provided on an inner wall of each of the side walls 301 of the circuit-board holder 300. Thus, each of the ribs 303A contacts each of the lateral sides of the rear side of the sensor board 350. Further, each of the two ribs 303B positioned downstream in the insertion direction A is provided on an inner wall of each of the side walls 301 of the circuit-board holder 300. Thus, each of the ribs 303B contacts each of the lateral sides of the rear side of the sensor board 350.

Further, the circuit-board holder 300 according to the present embodiment includes a third restraint that restricts the movement of the sensor board 350, which has been inserted into a predetermined position illustrated in FIG. 3, in the insertion direction A. The third restraint according to the present embodiment is implemented by a snap-fit portion 304. One end of the snap-fit portion 304 in the insertion direction A is fixed, and the other end of the snap-fit portion 304 in the insertion direction A is made elastically deformable so as to shift in a normal-line direction to the surface of the sensor board 350. More specifically, the above one end of the snap-fit portion 304 according to the present embodiment is fixed to the inner wall of each of the side walls 301 of the circuit-board holder 300 and is supported in a cantilevered state.

A downstream end (the other end) of the snap-fit portion 304 in the insertion direction A is a free end. A boss 304a (See FIGS. 2, 4, and 5) which is a projecting portion as an engagement portion is disposed at the downstream end. The boss 304a is provided so as to protrude from the snap-fit portion 304 toward the sensor board 350 in a normal-line direction to the surface of the sensor board 350. As illustrated in FIG. 3, the boss 304a (see FIG. 2) enters and engages with the through hole 354, which is an engaged portion of the sensor board 350, to restrict the movement of the sensor board 350 in the insertion direction A.

Further, the circuit-board holder 300 of the present embodiment includes a fourth restraint that restricts the sensor board 350, which has been inserted to the predetermined position illustrated in FIG. 3, from moving downstream in the insertion direction A. The fourth restraint of the present embodiment includes an end wall 305 of the circuit-board holder 300 positioned downstream in the insertion direction A in which the sensor board 350 is inserted. Thus, even if the sensor board 350 is further pushed toward downstream in the insertion direction A from the predetermined position and the restriction of the sensor board 350 by the boss 304a of the snap-fit portion 304 is released, the downstream end in the insertion direction A of the sensor board 350 abuts against an inner wall of the end wall 305 of the circuit-board holder 300. Accordingly, the sensor board 350 is prevented from moving downstream in the insertion direction A.

In addition, the circuit-board holder 300 of the present embodiment includes a screw fixing hole 306a through which a screw passes. The screw fixes the circuit-board holder 300 to a metallic frame (object) of the sheet bank 43. The screw fixing hole 306a is formed in an extending portion 306 extending from an outer wall surface of the end wall 305 of the circuit-board holder 300 downstream in the insertion direction A.

When the sensor board 350 is mounted to the circuit-board holder 300 of the present embodiment, the downstream end of the sensor board 350 in the insertion direction A is inserted between the projecting portions 302A and the rib 303A on an upstream end of the circuit-board holder 300 in the insertion direction A. The sensor board 350 is inserted into the circuit-board holder 300 in a direction parallel to the surface of the sensor board 350. Such a configuration allows the sensor board 350 to be inserted into the circuit-board holder 300 in the direction parallel to the surface of the sensor board 350, while the movement of the sensor board 350 to the lateral sides in the insertion direction A in which the sensor board 350 is inserted, is restricted by the side walls 301 and the movement of the sensor board 350 in the normal-line direction to the surface of the sensor board 350 is restricted by the projecting portions and the ribs.

When the sensor board 350 is inserted to the predetermined position as illustrated in FIG. 3, the boss 304a of the snap-fit portion 304 is fitted into the through hole 354 of the sensor board 350 by snap fit. More specifically, when the sensor board 350 is inserted close to the predetermined position, the downstream end of the sensor board 350 in the direction in which the sensor board 350 is inserted, contacts the boss 304a of the snap-fit portion 304. At this time, a surface of the boss 304a contacted by the sensor board 350 is a tapered surface as illustrated in FIG. 2. Accordingly, when the sensor board 350 is further inserted and the tapered surface of the boss 304a is pushed by the sensor board 350 toward downstream in the direction in which the sensor board 350 is inserted, a rotational moment around the fixed end of the snap-fit portion 304 is generated in the snap-fit portion 304.

The rotational moment causes the snap-fit portion 304 to bend such that the boss 304a of the snap-fit portion 304 rotates in a direction away from the rear side of the sensor board 350 around the fixed end of the snap-fit portion 304. Thus, the downstream end of the sensor board 350 in the direction in which the sensor board 350 is inserted (insertion direction A), can move further downstream in the insertion direction A beyond the boss 304a. When the sensor board 350 is inserted to the predetermined position illustrated in FIG. 3, the through hole 354 of the sensor board 350 is positioned at the boss 304a of the snap-fit portion 304. Accordingly, the elasticity (resilience of elastic deformation) of the snap-fit portion 304 causes the boss 304a of the snap-fit portion 304 to rotate around the fixed end of the snap-fit portion 304 in a direction in which the boss 304a approaches the rear side of the sensor board 350. Thus, the boss 304a of the snap-fit portion 304 enters the through hole 354 of the sensor board 350.

As described above, the boss 304a of the snap-fit portion 304 enters the through hole 354 of the sensor board 350 by the snap-fit portion 304, such that the movement of the sensor board 350 in the insertion direction A is restricted by the boss 304a of the snap-fit portion 304. In other words, even if an attempt is made to move the sensor board 350 in a state in which the boss 304a of the snap-fit portion 304 has entered the through hole 354 toward upstream in the insertion direction A, the through hole 354 is caught by the boss 304a and the sensor board 350 is not moveable.

Figure 6A:
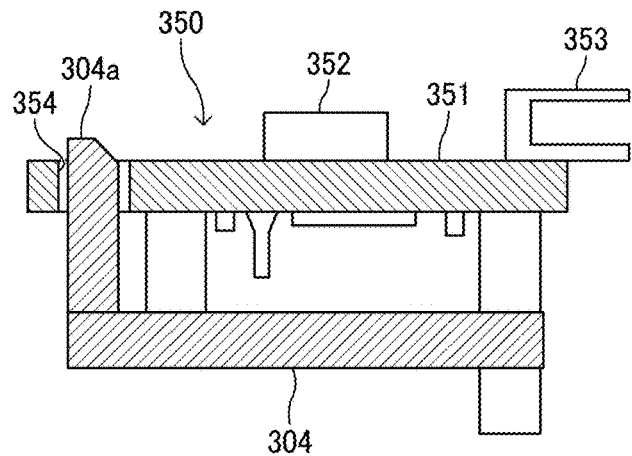
FIG. 6A is a schematic cross-sectional view of a circuit-board holder into which a sensor board is inserted and held at a predetermined position, where the cross section is cut in the insertion direction and passes through a through hole, according to an embodiment of the present disclosure.
Figure 6B:
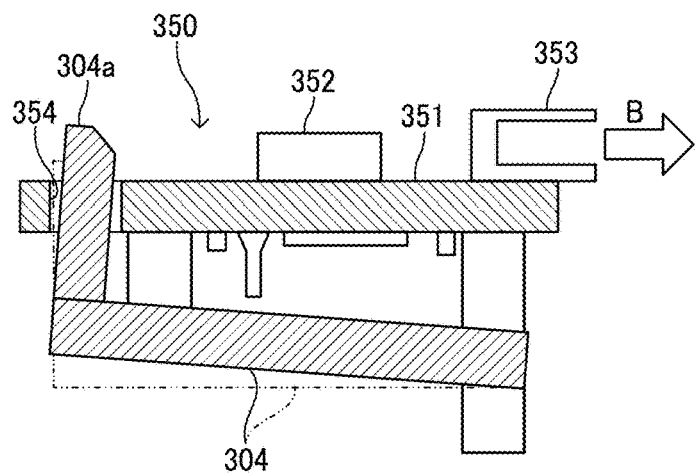
FIG. 6B is a schematic cross-sectional view of the circuit-board holder of FIG. 6A that holds the sensor board, illustrating a state in which the sensor board is pulled out.

FIGS. 6A and 6B are schematic cross-sectional views of the circuit-board holder 300 and the sensor board 350, where the cross section is cut in the insertion direction A and passes through the through hole 354, according to the present embodiment.

As illustrated in FIG. 6A, the sensor board 350 held at the predetermined position in the circuit-board holder 300 may receive a force in pull-out direction B opposite to the insertion direction A. For example, when a failure occurs in the sensor board 350, a harness on the printer 100 connected to the connector 353 on the sensor board 350 may be pulled out from the connector 353 for repair. At this time, the sensor board 350 receives a force in the pull-out direction B. In such a case, the through hole 354 pushes the boss 304a in the pull-out direction B. However, it is necessary that the boss 304a does not come out of the through hole 354 and the circuit board holding state can be maintained.

The snap-fit portion 304 of the present embodiment is disposed such that the fixed end of the snap-fit portion 304 is positioned upstream in the insertion direction A. In the case in which the snap-fit portion 304 is disposed as described above, even the sensor board 350 receives force in the pull-out direction B and the through hole 354 presses the boss 304a toward upstream in the insertion direction A, an inner edge of the through hole 354 contacts the wall surface of the boss 304a at a substantially right angle. Most of the pressing force of the through hole 354 is directed toward the fixed end of the snap-fit portion 304. Accordingly, a sufficient rotational moment is not generated in the snap-fit portion 304. Thus, the boss 304a does not come out of the through hole 354. Even if the rotational moment is generated in the snap-fit portion 304, as illustrated in FIG. 6B, the rotational moment is generated in a direction in which the boss 304a enters the through hole 354. Thus, the boss 304a does not come out of the through hole 354. Accordingly, even if the sensor board 350 receives a force in the pull-out direction B, the circuit-board holder 300 can maintain a state in which the sensor board 350 is held.

There may be a case in which the fixed end of the snap-fit portion 304 is disposed so as to be positioned downstream in the insertion direction A. In such a case also, when the sensor board 350 receives the force in the pull-out direction B, even if the through hole 354 pushes the boss 304a toward upstream in the insertion direction A, sufficient rotational moment is not generated in a similar manner. Thus, the boss 304a does not come out of the through hole 354. However, when a large force is applied in the pull-out direction B and a relatively large rotational moment is generated, the direction of the rotational moment is a direction in which the boss 304a is pulled out from the through hole 354. Accordingly, the boss 304a is likely to be pulled out from the through hole 354. For this reason, as in the present embodiment, preferably, the fixed end of the snap-fit portion 304 is disposed so as to be positioned upstream in the insertion direction A.

On the other hand, when the sensor board 350 in a state in which the boss 304a of the snap-fit portion 304 has entered the through hole 354 is moved in the insertion direction A, the inner edge of the through hole 354 contacts a tapered surface of the boss 304a. For this reason, when the through hole 354 pushes the boss 304a in the insertion direction A, a rotational moment is generated in the snap-fit portion 304. Accordingly, the snap-fit portion 304 can rotate in a direction in which the boss 304a comes out of the through hole 354.

However, in the present embodiment, as described above, even when the sensor board 350 is further pushed in the insertion direction A from the predetermined position, the downstream end of the sensor board 350 in the insertion direction A abuts against the inner wall surface of the end wall 305 of the circuit-board holder 300. Accordingly, the sensor board 350 is restricted from moving downstream in the insertion direction A and the boss 304a does not come out of the through hole 354. Accordingly, the sensor board 350 cannot move downstream in the insertion direction A from the predetermined position.

As described above, the circuit-board holder 300 of the present embodiment can hold the sensor board 350 by the snap fit of the snap-fit portion 304. At this time, the sensor board 350 is held in a state in which the movement of the sensor board 350 to the lateral sides in the insertion direction A is restricted by the side walls 301 and the movement of the sensor board 350 in the normal-line direction to the surface of the sensor board 350 is restricted by the projecting portions 302A and 302B and the ribs 303A and 303B.

Preferably, the elasticity of the snap-fit portion 304 of the present embodiment, allows the snap-fit portion 304 to bend such that the boss 304a engaged with the through hole 354 of the sensor board 350 can be easily displaced in the normal-line direction to the surface of the sensor board 350 when the sensor board 350 is inserted. On the other hand, after the boss 304a has been engaged with the through hole 354, preferably, the snap-fit portion 304 has an elasticity such that the snap-fit portion 304 does not easily bend to stably maintain a state in which the boss 304a and the through hole 354 are engaged. The length in the longitudinal direction (length in the insertion direction A) of the snap-fit portion 304 needs to be an appropriate length to realize an elastic force that can achieve the elasticity of the snap-fit portion 304 as described above.

The length of the snap-fit portion 304 of the present embodiment in the insertion direction A is a corresponding length as illustrated in FIG. 4 to realize such an elastic force. However, an increase in the dimension of the circuit-board holder 300 in the insertion direction A due to the length of the snap-fit portion 304 in the insertion direction A can be avoided for the following reason.

As illustrated in FIGS. 2 and 3, the length of the sensor board 350 in the insertion direction A is relatively long to secure an installation area for components (such as temperature sensor 352, connector 353, wiring) mounted on the sensor board 350. The circuit-board holder 300 includes the side wall 301 for restraint the movement of the sensor board 350 to the lateral sides in the insertion direction, a pair of projecting portions 302A and 302B, and a pair of ribs 303A and 303B for restraint the movement of the sensor board 350 in a normal-line direction to the surface of the sensor board 350. For this reason, the length of the circuit-board holder 300 in the insertion direction A is a length corresponding to the length of the sensor board 350 to be inserted in the insertion direction A such that the side walls 301, the projecting portions 302A and 302B, and the ribs 303A and 303B are provided. As known in the art, the length of the circuit-board holder 300 in the insertion direction A is sufficiently longer than the length of the snap-fit portion 304 in the insertion direction A necessary to obtain the elastic force needed for the appropriate snap-fit. For this reason, the length of the snap-fit portion 304 in the insertion direction A does not exceed the length of the circuit-board holder 300 in the insertion direction A necessary to execute the intended function (function of holding the sensor board 350), and an increase in the size of the circuit-board holder 300 in the insertion direction A can be avoided.

The circuit-board holder 300 of the present embodiment is disposed such that the longitudinal direction (direction in the insertion direction A) of the snap-fit portion 304 is parallel to the surface of the sensor board 350. For this reason, the length of the snap-fit portion 304 in a normal-line direction to the surface of the sensor board 350 (including the height of the boss 304a) is short and sufficiently shorter than the length of the sensor board 350 in a normal-line direction to the surface of the sensor board 350, which is the sum of the thicknesses of the circuit board and the heights of components on the circuit board. Accordingly, the size of the circuit-board holder 300 in a normal-line direction to the surface of the sensor board 350 can be reduced as compared with a comparative circuit-board holder in which a circuit board is inserted in a normal-line direction to the surface of the circuit board and the inserted circuit board is held by the snap fit of a restraint.

In particular, the circuit-board holder 300 of the present embodiment holds the sensor board 350 on which a sensor component such as the temperature sensor 352 is mounted. In the present embodiment in which the above-described sensor board 350 is held, a configuration in which components of the circuit-board holder 300 are disposed around the sensor component may prevent the sensor component from functioning as a sensor. For this reason, such a configuration is not preferable.

In the circuit-board holder 300 of the present embodiment, as described above, the length of the snap-fit portion 304 in a normal-line direction to the surface of the sensor board 350 is sufficiently shorter than the length of the sensor board 350 in a normal-line direction to the surface of the sensor board 350, which is a sum of the circuit board thickness and the height of, for example, components on the circuit board. Accordingly, the snap-fit portion 304 does not extend to the periphery of the sensor component, i.e., the temperature sensor 352 on the sensor board 350. Thus, the detection of the sensor component from being hindered by the snap-fit portion 304 can be prevented.

Figure 7:
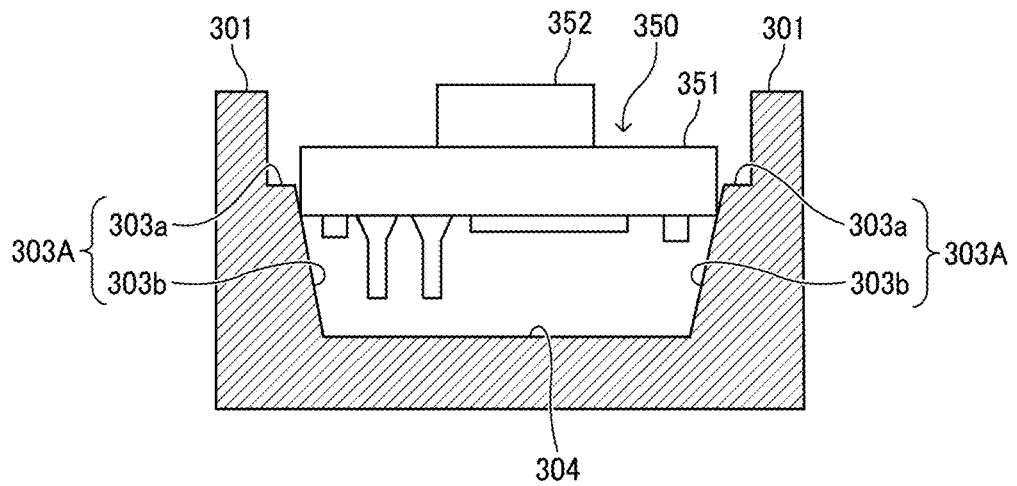
FIG. 7 is a schematic cross-sectional view of a circuit-board holder, where the cross section is cut across two ribs positioned at an upstream portion of the circuit-board holder in the insertion direction of a sensor board, according to an embodiment of the present disclosure.

FIG. 7 is a schematic cross-sectional view of the circuit-board holder 300, where the cross section is cut across the two ribs 303A positioned at an upstream portion of the circuit-board holder 300 in the insertion direction A of the sensor board 350, according to the present embodiment.

As known in the art, each of the two ribs 303A positioned upstream in the insertion direction A of the circuit-board holder 300 of the present embodiment contacts the rear surface of each of the lateral sides of the sensor board 350 at an upper end plane 303a to restrict the movement of the sensor board 350 toward the rear surface of the sensor board 350. However, as illustrated in FIG. 7, a bottom surface of lateral sides of the sensor board 350 may not overlap the upper end plane 303a due to dimensional variations of the circuit board 351 in the sensor board 350 or of the circuit-board holder 300.

At this time, if the upper end plane 303a of the two ribs 303A is sufficiently wide (if the dimension of the upper end plane 303a in a direction perpendicular to the insertion direction A is increased), such a situation can be avoided. However, the upper end plane 303a cannot be sufficiently wide to prevent the two ribs 303A from interfering with, for example, components, wiring on the sensor board 350.

For this reason, each of the inner end surfaces of the two ribs 303A (surfaces of the two ribs 303A facing each other)

in the present embodiment is an inclined surface 303b which is inclined further inward as the inclined surface 303b goes toward the rear surface of the sensor board 350. Thus, the distance between the inner end surfaces of the two ribs 303A gradually decreases toward the rear surface of the sensor board 350. As a result, even when the rear surface of the lateral sides of the sensor board 350 does not overlap the upper end plane 303a, the sensor board 350 can be sandwiched and held between the inner end surfaces of the two ribs 303A before the rear surface of the sensor board 350 contacts the snap-fit portion 304.

In the circuit-board holder 300 of the present embodiment, as illustrated, for example, in FIG. 5, the fixed end of the snap-fit portion 304 is supported by the side wall 301. With such a configuration, an upstream portion of the circuit-board holder 300 in the insertion direction A has no wall portion and is open. In a configuration in which the wall portion is provided in an upstream portion of the circuit-board holder 300 in the insertion direction A, for example, when a harness on the body of the printer 100 is connected to the connector 353 on the sensor board 350 held by the circuit-board holder 300, fingers of an operator touches the wall portion. Thus, connecting the harness to the connector 353 is difficult. In addition, when the sensor board 350 needs to be pulled out from the circuit-board holder 300, preferably, an upstream end of the sensor board 350 in the insertion direction A is pinched with fingers to pull out the sensor board 350 held by the circuit-board holder 300. However, in a configuration in which a wall portion is provided upstream in the insertion direction A for the circuit-board holder 300, holding the upstream end of the sensor board 350 in the insertion direction A with fingers is difficult. Similar to the present embodiment, a configuration in which no wall portion is provided in an upstream portion of the circuit-board holder 300 in the insertion direction A and the wall portion is opened, allows the workability to be enhanced.

Figure 8A:
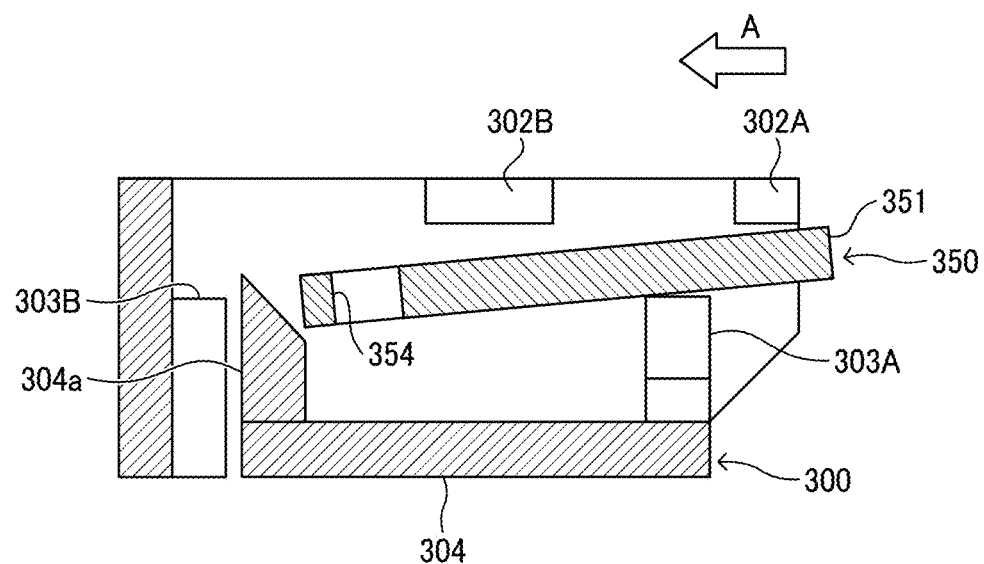
FIG. 8A is a schematic cross-sectional view of a circuit-board holder, where the cross section is cut in the insertion direction of a sensor board and passes through a through hole of the circuit-board holder, according to an embodiment of the present disclosure.
Figure 8B:
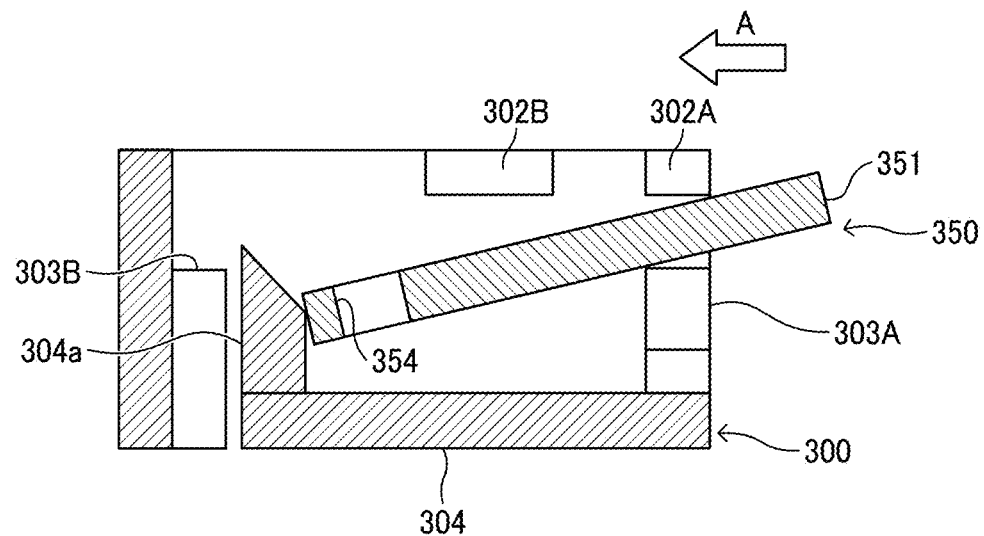
FIG. 8B is a schematic cross-sectional view of a circuit-board holder in which projecting portions at an upstream portion of the circuit-board holder in the insertion direction of a sensor board and ribs at an upstream portion of the circuit-board holder in the insertion direction of the sensor board are disposed at substantially the same positions upstream in the insertion direction of the sensor board, according to a control sample of the above embodiment of the present disclosure.

FIGS. 8A and 8B are schematic cross-sectional views of the circuit-board holder 300 and the sensor board 350, where the cross section is cut along in the insertion direction A of the sensor board 350 and passes through the through hole 354 of the circuit-board holder 300, according to the present embodiment.

In the present embodiment, as described above, the second restraints that restrict the movement of the sensor board 350 in a normal-line direction to the surface of the sensor board 350 includes the two projecting portions 302A and 302B and the ribs 303A and 303B that are disposed at different positions in the insertion direction A.

At this time, as illustrated in FIG. 8B, the projecting portions 302A positioned upstream in the insertion direction A and the rib 303A positioned upstream in the insertion direction A are disposed at substantially the same position in the insertion direction A. In this case, a gap or clearance between the projecting portions 302A and the rib 303A and the sensor board 350 allows the sensor board 350 to be largely rotated around a position sandwiched between the projecting portions 302A and the rib 303A.

In the present embodiment, the projecting portions 302A positioned downstream in the insertion direction A are disposed between the two ribs 303A and 303B in the insertion direction A. For this reason, even if the downstream end of the sensor board 350 in the insertion direction A rotates toward a front side of the sensor board 350, the sensor board 350 contacts the projecting portions 302B. Thus, the rotation of the sensor board 350 beyond a position at which the sensor board 350 contacts the projecting portions 302B is restricted.

However, the ribs 303B positioned downstream in the insertion direction A are disposed further downstream than the projecting portions 302A positioned downstream in the insertion direction A. For this reason, when the sensor board 350 rotates toward the rear surface of the sensor board 350, the sensor board 350 does not contact the ribs 303B until the downstream end of the sensor board 350 in the insertion direction A reaches the projecting portions 302B. Thus, the sensor board 350 can rotate significantly as illustrated in FIG. 8. In this case, there is a possibility that the downstream end of the sensor board 350 in the insertion direction A abuts against a position deviated from the tapered surface of the boss 304a near the base of the boss 304a of the snap-fit portion 304. For this reason, a rotational moment around the fixed end of the snap-fit portion 304 is not generated. Thus, an appropriate snap fit may not be obtained.

For this reason, in the present embodiment, as illustrated in FIG. 8A, the projecting portions 302A positioned upstream in the insertion direction A are disposed further upstream in the insertion direction A with respect to the ribs 303A positioned extreme upstream in the insertion direction A. Such an arrangement as described above allows the sensor board 350 to contact the projecting portions 302A when the sensor board 350 attempts to rotate toward the rear surface of the sensor board 350 before the downstream end of the sensor board 350 in the insertion direction A reaches the projecting portions 302B. Thus, further rotation of the sensor board 350 is restricted. Accordingly, the downstream end of the sensor board 350 in the insertion direction A can abut against the tapered surface of the boss 304a of the snap-fit portion 304. Thus, appropriate snap fit can be stably obtained.

The embodiments described above are given as examples, and unique advantageous effects are achieved for each of following aspects given below.

First Aspect

According to the first aspect of the present disclosure, the circuit-board holder 300 holds a circuit board such as the sensor board 350 using a snap fit and includes a first restraint such as the side walls 301, a second restraint such as the projecting portions 302A and 302B as well as the ribs 303A and 303B, and a third restraint such as the snap-fit portion 304. The first restraint restricts the sensor board 350 from moving in a direction orthogonal to the insertion direction A of the circuit board 350, where the sensor board 350 is inserted to the circuit-board holder 300 in a direction parallel to the surface of the sensor board 350. The second restraints restricts the sensor board 350 from moving in a normal-line direction to the surface of the sensor board 350. The third restraint restricts the sensor board 350 from moving in the insertion direction A when the circuit board 350 has been inserted to a predetermined position. One end of the third restraint in the insertion direction A is fixed and the other end of the third restraint in the insertion direction A is elastically deformable and displaceable in a normal-line direction to the surface of the sensor board. Also, the third restraint includes an engagement portion such as the boss 304a at the other end of the third restraint and the third restraint is engaged with a to-be-engaged portion such as the through hole 354 of the circuit board using a snap fit. Thus, the third restraint restricts the circuit board from moving in the insertion direction A.

In a circuit-board holder according to the related art, a circuit board is inserted in a normal-line direction to the surface of the circuit board and the inserted circuit board is held by the snap fit of a restraint portion. In the case of such a configuration, the restraint needs an elastic force with which the restraint can be easily bent so that the engagement portion engaged with the engaged portion of the circuit board can be displaced in a direction parallel to the surface of the circuit board (circuit board surface parallel direction) when the circuit board is inserted. On the other hand, after the engagement portion and the engaged portion have been engaged, an elastic force that prevents the restraint from being easily bent is needed to stably maintain a state in which the engagement portion and the engaged portion are engaged. Generally, the restraint has high rigidity. Accordingly, the length of the restraint in a normal-line direction to the surface of the circuit board needs to be set to a suitable length to realize an elastic force that satisfies the functions described above. For this reason, the dimension of the circuit-board holder in a normal-line direction to the surface of the circuit board is large.

In the circuit-board holder 300 according to the first aspect of the present disclosure, the circuit board is inserted in the direction parallel to the surface of the circuit board. More specifically, the circuit board is inserted into the circuit-board holder 300 in the direction parallel to the surface of the circuit board while the movement of the circuit board to the lateral sides in the circuit board insertion direction is restricted by the first restraint and the movement of the circuit board in a normal-line direction to the surface of the circuit board is restricted by the second restraint. When the circuit board is inserted to a predetermined position in the circuit-board holder, the engagement portion of the third restraint is engaged with the engaged portion of the circuit board using a snap fit to restrict the movement of the circuit board in the circuit board insertion direction. Accordingly, the circuit board is held by the circuit-board holder 300.

In the first aspect, one end of the third restraint in the circuit board insertion direction is fixed and the other end of the third restraint in the circuit board insertion direction (the end on which the engagement portion is disposed) is elastically deformable so as to be displaced in a normal-line direction to the surface of the circuit board. Thus, snap fit is enabled. In this configuration, when the rigidity of the third restraint is high, the length of the third restraint in the circuit board insertion direction (the direction parallel to the surface of the circuit board) needs to be set to an appropriate length to realize the above-described elastic force necessary for the snap fit. However, the length of the third restraint in a normal-line direction to the surface of the circuit board may be short. For this reason, according to the first aspect, the dimension of the circuit-board holder 300 in a normal-line direction to the surface of the circuit board can be reduced.

Second Aspect

According to the second aspect of the present disclosure, the engaged portion of the first aspect is the through hole 354 provided in the circuit board and the engagement portion of the first aspect is the protruding portion (for example, the boss 304*a*) fitted into the through hole.

According to such a configuration, snap fit is enabled by employing the through-hole provided in the circuit board for passing a screw for directly fixing the circuit board to an object such as a frame of an apparatus.

Third Aspect

According to the third aspect of the present disclosure, the one end of the third restraint according to the first or the second aspect is disposed on an upstream end of the circuit-board holder in the insertion direction of the circuit board.

The circuit board held at the predetermined position in the circuit-board holder may receive a force in the pull-out direction opposite to the circuit board insertion direction. In the third aspect, even in such a case, when the above-described force causes the engaged portion to push the engagement portion toward upstream in the circuit board insertion direction to bend the third restraint, a force in a direction opposite to the direction in which the engagement portion is disengaged from the engaged portion is generated. Accordingly, even in the above-described case, the engagement portion is unlikely to be disengaged from the engaged portion. Thus, the circuit-board holder can maintain a state in which the circuit board holds the circuit board.

Fourth Aspect

According to the fourth aspect of the present disclosure, the one end of the third restraint according to the third aspect is supported by the first restraint.

Accordingly, a wall portion is not provided on an upstream end of the circuit-board holder in the insertion direction of the circuit board and the upstream end of the circuit-board holder is open. Such a configuration prevents fingers of an operator from hitting the wall portion and from interfering with an operation when, for example, the harness on the body of the apparatus is connected to the connector on the circuit board held by the circuit-board holder. In addition, for example, even in a case in which the upstream end in the insertion direction of the circuit board held by the circuit-board holder is picked up and pulled out with fingers of an operator, a situation in which the fingers of the operator hit the wall portion and interfere with the operation can be avoided. Thus, workability is enhanced.

Fifth Aspect

In the fifth aspect of the present disclosure, the circuit board according to any one of the first to fourth aspects, includes the fourth restraint such as the end wall 305 that restricts the movement of the circuit board inserted to the predetermined position toward downstream in the insertion direction of the circuit board.

Such a configuration as described above allows the fourth restraint to restrict the circuit board from moving toward downstream in the insertion direction of the circuit board, even if the circuit board is further pushed from the predetermined position toward downstream in the insertion direction of the circuit board and the engagement portion of the third restraint is disengaged from the engaged portion of the circuit board. Accordingly, the circuit board can be more stably held by the circuit-board holder.

Sixth Aspect

According to the sixth aspect of the present disclosure, the second restraint according to any one of the first to fifth aspects includes a plurality of first surface restraints such as the projecting portions 302A and 302B that contact and restrict a first surface of the circuit board such as a front surface of the circuit board at different positions in the insertion direction of the circuit board, and a plurality of second surface restraints such as ribs 303A and 303B that contact and restrict the movement of a second surface of the circuit board such as the rear side of the circuit board at different positions in the insertion direction of the circuit board. The multiple first surface restraints include a first surface restraint such as the projecting portions 302A positioned upstream from a most upstream second surface restraint such as the ribs 303A that is positioned most upstream among the multiple second surface restraints such as the projecting portions 302A in the insertion direction of the circuit board, and a first surface restraint such as the projecting portions 302B positioned upstream in the insertion direction of the circuit board than a second surface restraint such as the ribs 303B that is positioned downstream from the most upstream second surface restraint such as the ribs 303B and second most upstream among the multiple second surface restraints in the insertion direction of the circuit board.

Such a configuration as described above allows the circuit board, which is inserted between the first surface restraints positioned upstream in the insertion direction of the circuit board and the most extreme upstream second surface restraints, to be restricted from largely rotating around the point sandwiched therebetween. Accordingly, when the circuit board is inserted, the downstream end of the circuit board in the insertion direction of the circuit board is not inserted with a large deviation in the normal-line direction to the surface of the circuit board. Thus, an appropriate snap-fit can be realized.

Seventh Aspect

According to the seventh aspect of the present disclosure, the circuit board according to any one of the first to sixth aspects, is the sensor board 350 on which a sensor such as the sheet-feeder temperature sensor 101 is mounted.

When the sensor board 350 is held, if components of the circuit-board holder are arranged around the sensor, detection by the sensor may be hindered. In the seventh aspect, the length of the third restraint in the normal-line direction to the surface of the sensor board is short. Thus, the third restraint can be prevented from extending to the periphery of the sensor on the sensor board 350. Accordingly, the detection of the sensor can be prevented from being hindered by the third restraint.

Eighth Aspect

According to the eighth aspect of the present disclosure, an image forming apparatus such as the printer 100 includes a circuit board such as the sensor board 350 detachably held by the circuit-board holder 300. The circuit-board holder 300 according to any one of the first to seventh aspects is employed as the circuit-board holder.

According to the eighth aspect, the dimension of the circuit-board holder holding the circuit board by the snap fit in a normal-line direction to the surface of the circuit board can be reduced. Thus, the image forming apparatus, in which the degree of freedom of the arrangement of the circuit board is enhanced, can be provided.

In the above descriptions, the term "printing" in the present disclosure may be used synonymously with, e.g., the terms of "image formation", "recording", "printing", and "image printing".

The suffixes Y, M, C, and K attached to each reference numeral indicate only that components indicated thereby are used for forming yellow, magenta, cyan, and black images, respectively, and hereinafter may be omitted when color discrimination is not necessary.

The above-described embodiments are illustrative and do not limit the present disclosure. Thus, numerous additional modifications and variations are possible in light of the above teachings. For example, elements and/or features of different illustrative embodiments may be combined with each other and/or substituted for each other within the scope of the present disclosure.

What is claimed is:

1. A circuit-board holder comprising:
a first restraint configured to restrict a circuit board from moving in a direction orthogonal to an insertion direction of the circuit board, the circuit board being inserted to the circuit-board holder in a direction parallel to a surface of the circuit board;
a second restraint configured to restrict the circuit board from moving in a normal-line direction to the surface of the circuit board; and
a third restraint configured to restrict the circuit board from moving in the insertion direction of the circuit board when the circuit board has been inserted to a prescribed position,
wherein one end of the third restraint in the insertion direction of the circuit board is fixed,
wherein another end of the third restraint in the insertion direction of the circuit board is elastically deformable and displaceable in a normal-line direction to the surface of the circuit board,
wherein the third restraint includes an engagement portion at said another end of the third restraint, and
wherein the third restraint is engaged with a to-be-engaged portion of the circuit board using a snap fit,
wherein the second restraint includes:
a plurality of first surface restraints that contact and restrict a first surface of the circuit board at different positions in the insertion direction of the circuit board, and
a plurality of second surface restraints that contact and restrict a second surface of the circuit board at different positions in the insertion direction of the circuit board,
one first surface restraint positioned upstream from a most upstream second surface restraint positioned most upstream among the plurality of second surface restraints in the insertion direction of the circuit board, and
another first surface restraint positioned upstream from a second-most upstream second surface restrain in the insertion direction of the circuit board,
wherein the second-most upstream second surface restrain is positioned downstream from the most upstream second surface restraint and second most upstream among the plurality of second surface restraints in the insertion direction of the circuit board.

2. The circuit-board holder according to claim 1,
wherein the to-be-engaged portion is a through hole of the circuit board, and
wherein the engagement portion is a projecting portion configured to fit into the through hole.

3. The circuit-board holder according to claim 1,
wherein the one end of the third restraint is disposed on an upstream end of the circuit-board holder in the insertion direction of the circuit board.

4. The circuit-board holder according to claim 3,
wherein the one end of the third restraint is supported by the first restraint.

5. The circuit-board holder according to claim 1,
wherein the circuit-board holder includes a fourth restraint configured to restrict the circuit board from moving toward downstream in the insertion direction of the circuit board when the circuit board has been inserted to the prescribed position.

6. The circuit-board holder according to claim 1,
wherein the circuit board is a sensor board on which a sensor is mounted.

7. An image forming apparatus comprising:
the circuit-board holder according to claim 1; and
the circuit board detachably held by the circuit-board holder.

* * * * *